United States Patent
Iida et al.

[11] Patent Number: 6,126,531
[45] Date of Patent: Oct. 3, 2000

[54] SLURRY RECYCLING SYSTEM OF CMP APPARATUS AND METHOD OF SAME

[75] Inventors: Shinya Iida; Akitoshi Yoshida, both of Ayase, Japan

[73] Assignee: SpeedFam Co., Ltd., Japan

[21] Appl. No.: 09/234,955

[22] Filed: Jan. 21, 1999

[30] Foreign Application Priority Data

Mar. 30, 1998 [JP] Japan ................................ 10-102046

[51] Int. Cl.⁷ .................................................. B24B 57/00
[52] U.S. Cl. .......................................... 451/447; 451/60
[58] Field of Search .................................. 451/8, 36, 41, 451/60, 87, 285, 288, 290, 446, 447

[56] References Cited

U.S. PATENT DOCUMENTS

| | | | |
|---|---|---|---|
| 5,658,185 | 8/1997 | Morgan, III et al. | 451/36 |
| 5,664,990 | 9/1997 | Adams et al. | 451/60 |
| 5,791,970 | 8/1998 | Yueh | 451/8 |

FOREIGN PATENT DOCUMENTS

| | | |
|---|---|---|
| 3-40537 | 8/1991 | Japan . |
| 7-221058 | 8/1995 | Japan . |
| 8-321479 | 12/1996 | Japan . |

*Primary Examiner*—Timothy V. Eley
*Assistant Examiner*—Dung Van Nguyen
*Attorney, Agent, or Firm*—Burr & Brown

[57] ABSTRACT

A slurry recycling system of a CMP apparatus, and a method of the same, which restores the state of agglomeration of the abrasive grains to the initial state to enable reuse of the slurry and thereby reduces the cost of the polishing work and improves the operating rate of the CMP apparatus. Slurry S used in the CMP apparatus 1 is sent to a dispersion chamber 31. A vibration element 40 of an ultrasonic dispersion apparatus 4 mounted in the dispersion chamber 31 is made to vibrate by a vibrator 41 to generate ultrasonic vibration energy, whereby the agglomerated particles in the slurry S are made to disperse. Suitably thereafter, the slurry S is returned to the slurry feed apparatus 300 to enable reuse of the slurry S.

8 Claims, 9 Drawing Sheets

FIG. 4

| | NO. OF RECYCLINGS | POLISHIING RATE (Å/min) | FLATNESS | SCRATCHING |
|---|---|---|---|---|
| EVALUATION TEST1 | 0 | 2486 | GOOD | NONE |
| | 5 | 2458 | GOOD | NONE |
| COMPARATIVE TEST1 | 0 | 2435 | GOOD | NONE |
| | 1 | 2319 | SOMEWHAT ENEVEN | SOME |
| EVALUATION TEST2 | 0 | 2545 | GOOD | NONE |
| | 3 | 2537 | GOOD | NONE |
| | 5 | 2560 | GOOD | NONE |
| EVALUATION TEST3 | 0 | 2451 | GOOD | NONE |
| | 1 | 2455 | GOOD | NONE |
| | 3 | 2445 | GOOD | NONE |
| COMPARATIVE TEST2 | 0 | 2513 | GOOD | NONE |
| | 2 | 2432 | GOOD | SOME |
| | 3 | 2355 | SOMEWHAT ENEVEN | YES |
| EVALUATION TEST4 | 0 | 2501 | GOOD | NONE |
| | 5 | 2487 | GOOD | NONE |
| EVALUATION TEST5 | 0 | 3838 | GOOD | NONE |
| | 2 | 3799 | GOOD | NONE |

SLURRY RECYCLING SYSTEM OF CMP APPARATUS AND METHOD OF SAME

BACKGROUND OF THE INVENTION

1. Field of the Invention

The present invention relates to a slurry recycling system for a chemical mechanical polishing (CMP) apparatus, and a method of the same, for recycling slurry used when polishing wafers etc. in a CMP apparatus.

2. Description of the Related Art

FIG. 9 is a schematic view of the configuration of a CMP apparatus.

As shown in FIG. 9, the CMP apparatus is provided with a platen 100 on the surface of which is attached a polishing pad 101 and a carrier 200 for holding a wafer W.

The wafer W is pressed against the top of the polishing pad 101 by the carrier 200. In this state, the platen 100 and carrier 200 are rotated relative to each other. Slurry S is continuously supplied from a slurry feed apparatus 300 to the top of the polishing pad. As a result, the precision of polishing and polishing rate of the wafer W are improved.

The slurry S used for the CMP apparatus, as explained in detail later, is comprised of metal oxides etc. of a primary particle size of not more than 10 $\mu$m dispersed in water or an organic solvent. If used for polishing a wafer W in a CMP apparatus, the state of agglomeration of the primary particles of the slurry S changes and the state of dispersion of the slurry S fluctuates from its initial value.

Accordingly, if such once used slurry S is reused in the CMP apparatus, the polishing rate will vary, the wafer W will not become the desired flatness, or large agglomerations of particles will cause scratching of the wafer W.

Therefore, in the past, the once used slurry S was received by a waste liquor receiver 110, stored in a waste liquor tank 120, then completely disposed of. Accordingly, a huge amount of the slurry came to be used. This became a major cause behind higher costs in polishing work.

As opposed to this, recently, the method has been proposed of filtering the once used slurry S using a filter, then reusing it.

The filter, however, becomes clogged in a short time and then has to be replaced with a new one.

Accordingly, it was necessary to stop the CMP apparatus when replacing the filter. This caused a reduction in the operating rate of the CMP apparatus. Further, a stable filtration action could not be achieved right after the filter was replaced with a new one. The polishing work consequently might be hindered during that time.

SUMMARY OF THE INVENTION

The present invention was made to solve the above problems and has as its object to provide a slurry recycling system for a CMP apparatus, and a method of the same, which restores the state of agglomeration of the abrasive to its initial state and enables reuse of the slurry so as to reduce the cost of the polishing work and improve the operating rate of the CMP apparatus.

According to a first aspect of the present invention, there is provided a slurry recycling system of a CMP apparatus comprising: a flow unit for causing the flow of a slurry comprised of abrasive grains of a metal oxide, metal nitride, metal carbide, or metal carbonate of a primary particle size in the initial state of 0.002 $\mu$m to 10 $\mu$m dispersed in water or an organic solvent and already used in the CMP apparatus; and an ultrasonic dispersion unit having a vibration element arranged in the flow unit and a vibrator for making the vibration element vibrate to generate ultrasonic vibration energy in the flow unit.

Due to this configuration, when the vibration element arranged in the flow unit is made to vibrate by the vibrator of the ultrasonic dispersion unit to generate the ultrasonic vibration energy, that ultrasonic vibration energy can disperse the agglomerated abrasive grain in the slurry flowing through the flow unit and can restore the state of dispersion of the slurry to close to the initial state.

Further, if foreign matter etc. in the slurry can be removed, more complete recycling becomes possible.

Therefore, the slurry recycling system of the CMP apparatus of the first aspect of the invention is preferably further provided in the flow unit with a filtration unit for filtering out the foreign matter of more than 10 $\mu$m size in the slurry. Further, the slurry recycling system of the CMP apparatus of the first aspect of the invention and its preferred embodiment are preferably further provided in the flow unit with a concentration adjusting unit for bringing the concentration of the slurry close to the concentration of the initial state. Still further, the slurry recycling system of the CMP apparatus of the first aspect of the invention and its preferred embodiments are preferably further provided in the flow unit with a pH adjusting unit for bringing the pH of the slurry close to the value of the initial state.

Due to these configurations, the state of dispersion, concentration, and pH of the slurry can be restored to substantially the initial state. As a result, it is possible to achieve more complete recycling and extend the life of the slurry.

The technique for recycling slurry may also be embodied as a process invention.

Therefore, according to a second aspect of the present invention, there is provided a slurry recycling method of a CMP apparatus comprising: a slurry flow step of causing the flow of a slurry comprised of abrasive grains of a metal oxide, metal nitride, metal carbide, or metal carbonate of a primary particle size in the initial state of 0.002 $\mu$m to 10 $\mu$m dispersed in water or an organic solvent and already used in the CMP apparatus; and an ultrasonic dispersion step of arranging a vibration element of an ultrasonic vibrator in the flow of the slurry and applying ultrasonic vibration energy to the slurry to cause the agglomerated abrasive to disperse and restore the state of dispersion of the slurry to close to the initial state.

Further, to achieve more complete recycling, the slurry recycling method of the CMP apparatus of the second aspect of the invention preferably further comprises a filtration step of filtering out the foreign matter of more than 10 $\mu$m size in the slurry. Further, the slurry recycling method of the CMP apparatus of the second aspect of the invention and its preferred embodiment preferably further comprise a concentration adjusting step for bringing the concentration of the slurry close to the concentration of the initial state. Still further, the slurry recycling method of the CMP apparatus of the second aspect of the invention and its preferred embodiments preferably further comprise a pH adjusting step for bringing the pH of the slurry close to the value of the initial state.

BRIEF DESCRIPTION OF THE DRAWINGS

These and other objects and features of the present invention will become clearer from the following description of the preferred embodiments given with reference to the attached drawings, in which:

FIG. 4 is a table of the results of evaluation tests;

DESCRIPTION OF THE PREFERRED EMBODIMENTS

Below, an explanation will be given of preferred embodiments of the present invention with reference to the drawings.

First Embodiment

Figure 1:
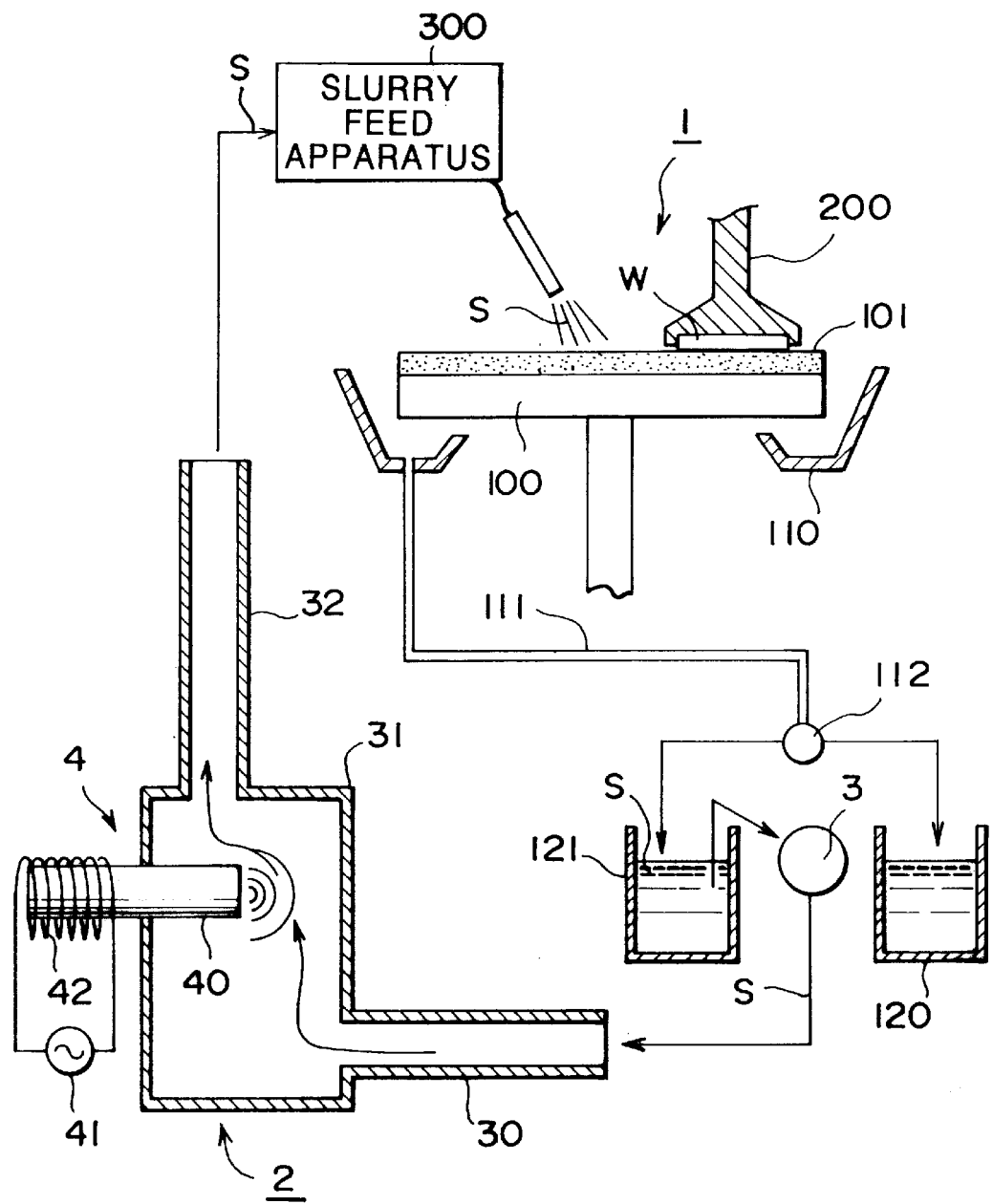
FIG. 1 is a schematic view of an example of application of the slurry recycling system for a CMP apparatus according to a first embodiment of the present invention to a single CMP apparatus.

FIG. 1 is a schematic view of an example of application of the slurry recycling system for a CMP apparatus according to a first embodiment of the present invention to a single CMP apparatus.

Figure 9:
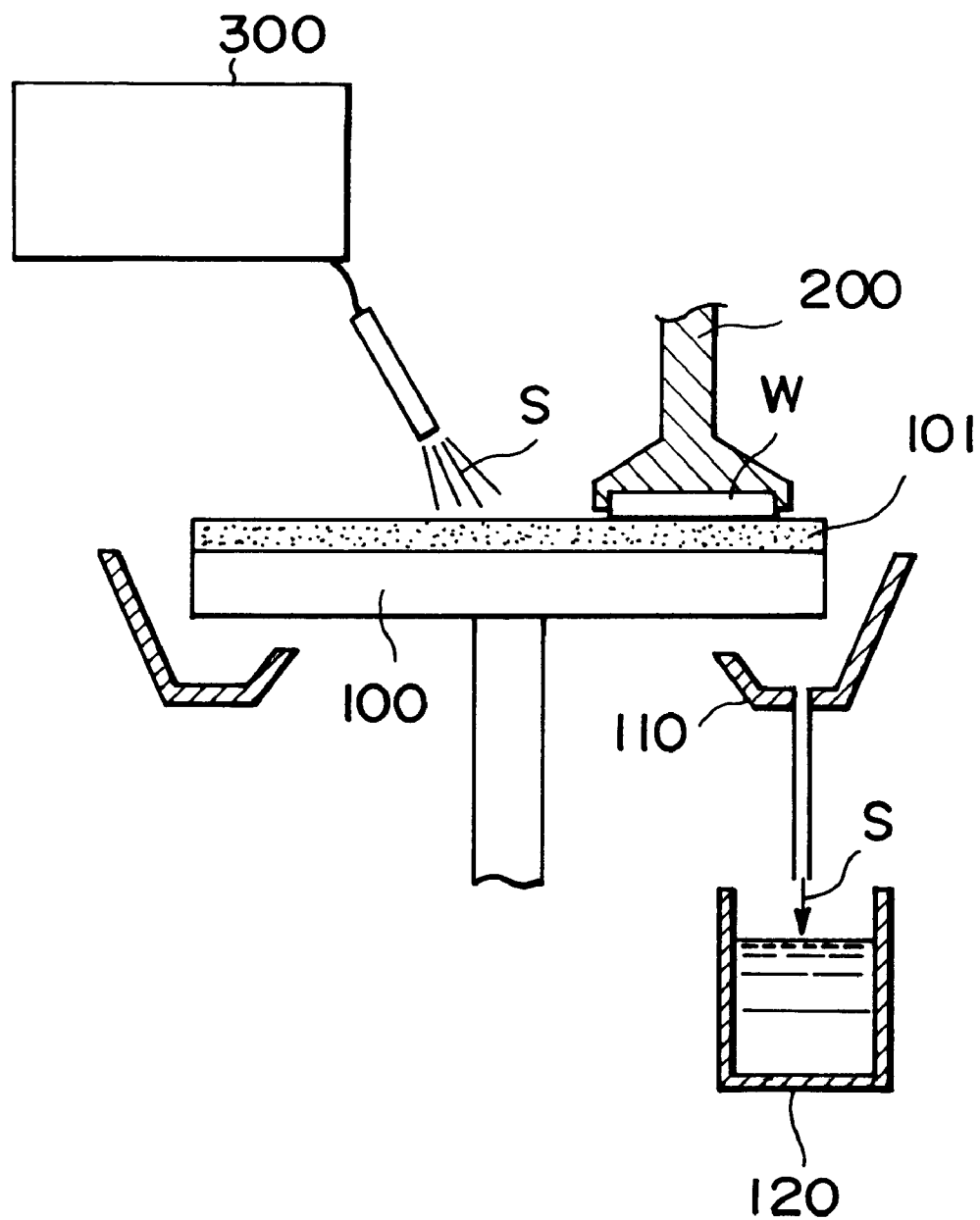
FIG. 9 is a schematic view of the configuration of a CMP apparatus.

Note that parts the same as those shown in FIG. 9 are given the same reference numerals in the explanation.

In FIG. 1, reference numeral 1 is a CMP apparatus and reference numeral 2 is a recycling system.

The CMP apparatus 1 is the same as the CMP apparatus shown in FIG. 9, except for the provision of a three-way cock valve 112 at the outlet of a pipe 111 communicating with a waste liquor receiver 110. By adjusting the valve 112, it is possible to store the used slurry S in a storage tank 121 or discharge the slurry S after cleaning of a platen 100 comprised almost entirely of water into a waste liquor tank 120. Note that here, a slurry comprised of abrasive grains of a metal oxide, metal nitride, metal carbide, or metal carbonate of a primary particle size in the initial state of 0.002 μm to 10 μm dispersed in water or an organic solvent is used.

The recycling system 2 is a technique which enables such a slurry S stored in the storage tank 121 reuse in the CMP apparatus 1. The recycling system 2 provides a pipe 30, dispersion chamber 31 and pipe 32 serving as the flow unit for flowing the slurry S in the storage tank 121 pumped out by a pump 3 into a slurry feed apparatus 300, and an ultrasonic dispersion apparatus 4 serving as the ultrasonic dispersion unit.

The ultrasonic dispersion apparatus 4 is a general apparatus and is constructed with a vibration element 40 arranged in a dispersion chamber 31 serving as the flow unit and with an ultrasonic vibrator 41 for making the vibration element 40 vibrate arranged outside of the dispersion chamber 31.

Specifically, the vibration element 40 is mounted in a manner enabling vibration to the dispersion chamber 31, a high frequency voltage is supplied to the coil 42 to make the vibration element 40 vibrate and thereby an ultrasonic wave is applied to the slurry S in the dispersion chamber 31.

Next, an explanation will be given of the operation of the slurry recycling system of a CMP apparatus according to this embodiment. Note that the operation specifically achieves the slurry recycling method of a CMP apparatus of the second aspect of the invention.

When the CMP apparatus 1 is driven, the silicon wafer W held at the rotating carrier 200 (hereinafter referred to simply as "the wafer W") is pressed against the top of the polishing pad 101 of the rotating platen 100 and slurry S is supplied continuously from the slurry feed apparatus 300 to the top of the platen 100.

Due to this, the interlayer insulating film of the wafer W is polished to be flat and uniform by the slurry S present between the wafer W and the polishing pad 101.

The slurry S on the platen 100 is discharged to the inside of the waste liquor receiver 110 by the centrifugal force of the platen 100 and is stored in the storage tank 121 through the pipe 111 and the valve 112.

The slurry S stored in the storage tank 121 is supplied by the pump 3 to the pipe 30 and is returned through the dispersion chamber 31 and the pipe 32 to the slurry feed apparatus 300 (slurry flow step).

If a slurry S comprised of a metal oxide, metal nitride, metal carbide, or metal carbonate, that is, abrasive (primary particles) of a primary particle size in the initial state of 0.002 μm to 10 μm dispersed in water or an organic solvent is used in the CMP apparatus 1, electrolyte ions are adsorbed at the primary particles, the primary particles agglomerate, and the state of dispersion of the slurry S changes from the initial state.

If such a slurry S enters the dispersion chamber 31, the action of the ultrasonic dispersion apparatus 4 causes the slurry S to be restored to a state of dispersion close to the initial state (ultrasonic dispersion step). That is, the particles to which electrolyte ions are adsorbed and the agglomerated particles receive the high frequency ultrasonic energy of the vibration of the vibration element 40 when passing near the vibration element 40. Therefore, the particles vibrate, the electrolyte ions adsorbed to the primary particles are separated from the primary particles, and the particles disperse uniformly in the dispersion medium. Further, the agglomerated particles are broken down by the vibration due to the ultrasonic wave and are dispersed to a state close to the primary particles. As a result, the slurry S is restored to a state of dispersion close to the initial state, so even if resupplied to the slurry feed apparatus 300 for use, there is almost no scratching of the wafer W.

In this way, according to this embodiment, reuse of the slurry S becomes possible, so it is possible to reduce the cost of the polishing work.

Figure 2:
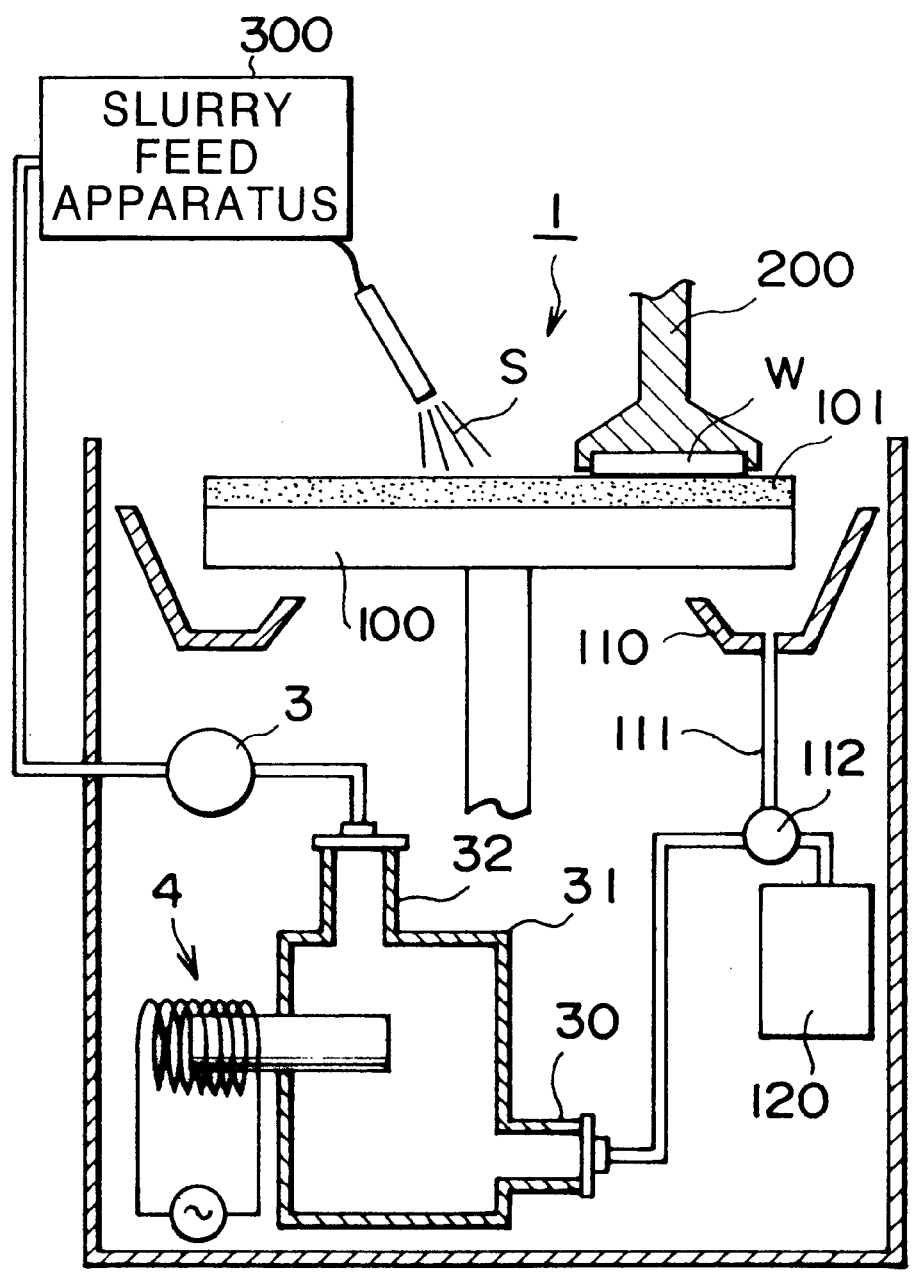
FIG. 2 is a schematic view of the state of assembly of the slurry recycling system of FIG. 1 in a single CMP apparatus.

Further, as shown in FIG. 2, by connecting the dispersion chamber 31 where the ultrasonic dispersion apparatus 4 is mounted to the valve 112 and feeding back the slurry S from the valve 112 to the slurry feed apparatus 300 by the pump 3, continuous operation of the CMP apparatus 1 becomes possible and the operating rate of the CMP apparatus 1 can be improved.

Second Embodiment

Figure 3:
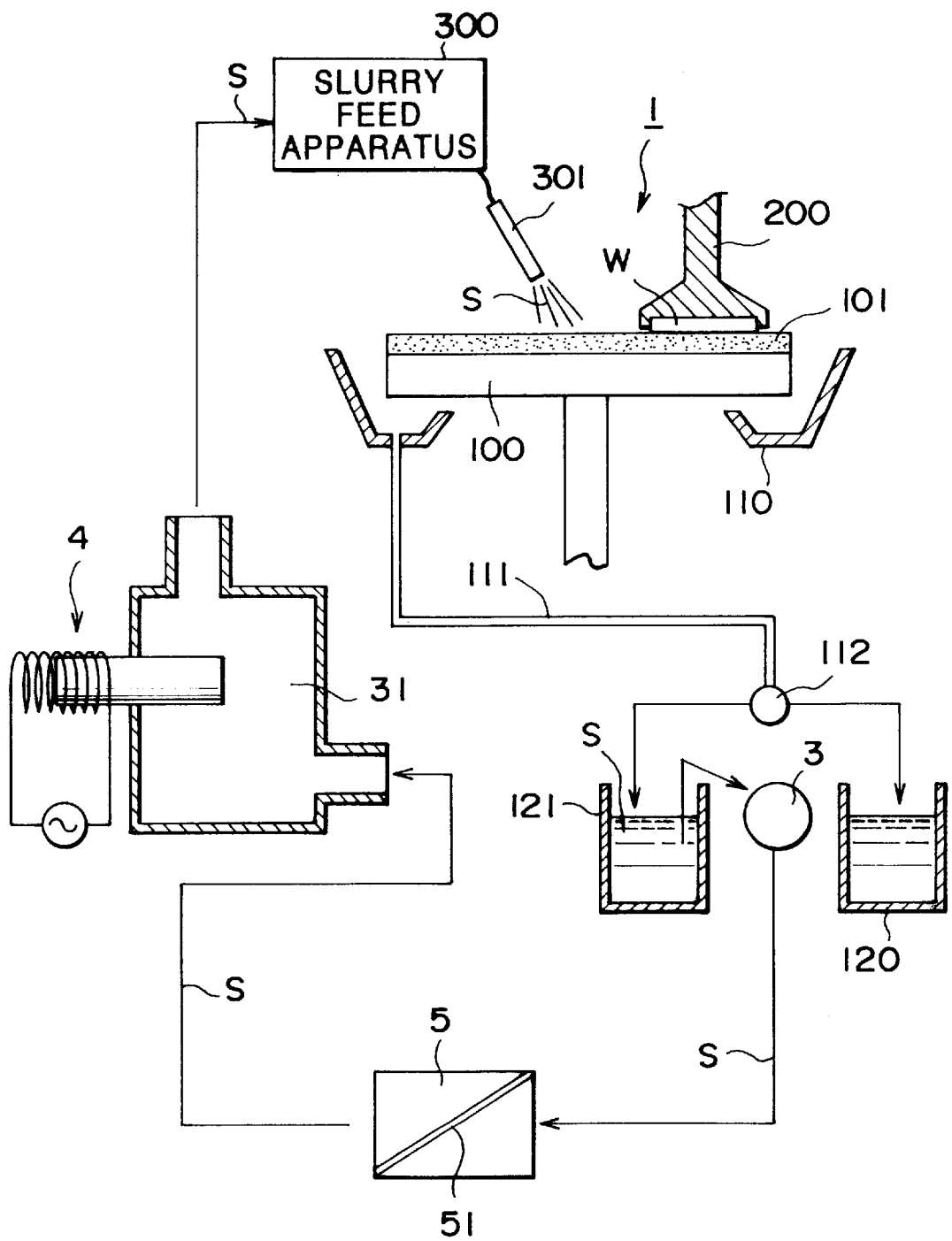
FIG. 3 is a schematic view of an example of application of the slurry recycling system for a CMP apparatus according to a second embodiment of the present invention to a single CMP apparatus.

FIG. 3 is a schematic view of a slurry recycling system of a CMP apparatus according to a second embodiment of the present invention.

The slurry recycling system of this embodiment differs from the first embodiment in the point that a filter 5 serving as the filtration part for filtering out foreign matter of a particle size of over 10 μm mixed in the slurry S is provided in the flow unit from the storage tank 121 to the pipe 30.

The filter 5 is a cartridge type filter having a mesh 51 of a size of 10 μm to 200 μm.

Due to this configuration, when the slurry S from the storage tank 121 passes through the mesh 51 of the filter 5, the contaminants of the polishing pad 101, polishing dross, dressing dross, and other foreign matter mixed in during polishing by the CMP apparatus 1 and agglomerated abrasives of a large particle size are deposited on the mesh 51 and removed (filtration step). Suitably thereafter, the ultrasonic dispersion apparatus 4 disperses the agglomerated primary particles etc. to enable improved restoration of the slurry S.

The rest of the configuration and the mode of operation and effects are similar to those of the first embodiment and therefore explanations thereof will be omitted.

The present inventors conducted the following evaluation tests to verify the effects of the recycling systems 2 of the first and second embodiments.

FIG. 4 is a table of the results of the evaluation tests.

In the following evaluation tests, a Model SH-24 polishing apparatus made by Speedfam Kabushiki Kaisha was used as the CMP apparatus 1, pads comprised of double layers of IC-1000 and SUBA-400 made by Rodel Inc. were used as the polishing pads 101, and the rotational speeds of the platen 100 and the carrier 200 were both set to 30 rpm.

In the evaluation test of the first embodiment (evaluation test 1), a 6-inch diameter, 0.4 μm thick plasma TEOS film-coated wafer (hereinafter referred to as the "wafer W1") was used and a slurry SC-1 made by CABOT (slurry comprised of fumed silica dispersed in water as a dispersant) with a silica solid content of 10.5 wt % (hereinafter referred to as the "slurry S1") was used.

Further, the wafer W1 was pressed by the carrier 200 by a pressure of 450 g/cm$^2$. The wafer W1 was polished for 1 minute while supplying slurry S1 from the slurry feed apparatus 300 at a rate of 180 cm$^3$/min.

Suitably thereafter, the used slurry S1 was stored in the storage tank 121, then was sent to the dispersion chamber 31 of the ultrasonic dispersion apparatus 4 by the pump 3. The ultrasonic dispersion apparatus 4 was made to operate for 2 minutes. At this time, the output of the vibrator 41 was set to a voltage of 100V and a power of 150 W, the vibration element 40 was made to vibrate by a high frequency of 20 kHz to generate an ultrasonic wave, and the slurry S1 was ultrasonically treated.

The ultrasonically treated slurry S1 was supplied from the slurry feed apparatus 300 to the CMP apparatus 1 for reuse.

This ultrasonic treatment and reuse were repeated five times, whereupon the polishing characteristics of the wafer W1 shown in the "Evaluation test 1" column of FIG. 4 were obtained. That is, even slurry S1 which has been reused five times could give an excellent flatness and did not cause scratches in the same way as when polishing the wafer W1 by unused slurry S1.

Further, the wafer W1 was polished under substantially the same conditions using unused slurry S1, then the used slurry S1 not treated ultrasonically was passed through a filter able to remove particles of over 50 μm size and reused, whereupon, as shown in the "Comparative test 1" column of FIG. 4, some unevenness resulted in the flatness of the wafer W1 and scratches were caused after just one use.

Next, an evaluation test of the second embodiment (evaluation test 2) was performed.

In this test, use was made of a filter 5 which had a mesh 51 of 100 μm size, the output of the vibrator 41 of the ultrasonic dispersion apparatus 4 was set to a voltage of 100V and a power of 600 W, the vibration element was made to vibrate at a high frequency of 20 kHz to generate an ultrasonic wave, and the slurry S1 was treated ultrasonically for one minute. The rest of the conditions were set to be the same as in evaluation test 1.

This reuse after filtration and ultrasonic treatment was repeated five times, whereupon the polishing characteristics of the wafer W1 shown in the "Evaluation test 2" column of FIG. 4 were obtained. That is, even with slurry S1 reused three times and five times, in the same way as when polishing a wafer W1 by unused slurry S1, a good flatness could be obtained and no scratches were caused.

Next, a 6-inch diameter, 0.5 μm thick thermal oxide film-coated wafer (hereinafter referred to as the "wafer W2") was pressed by the carrier 200 by a pressure of 500 g/cm$^2$. The wafer W1 was polished for 1 minute while supplying slurry S1 from the slurry feed apparatus 300 at a rate of 200 cm$^3$/min (evaluation test 3). At this time, a filter 5 having a mesh 51 of a 50 μm size was used. The rest of the conditions were set to the same as in the evaluation test 2.

In this case as well, the slurry was filtered and reused after ultrasonic treatment for three times, whereupon the polishing characteristics of the wafer W2 shown in the "Evaluation test 3" column of FIG. 4 were obtained. Even with a slurry S1 reused once and three times, a good flatness could be obtained and no scratches were caused. Note that similar results were obtained when the concentration of the slurry was set to 8.5 wt % and 12.5 wt %.

As opposed to this, when used slurry S1 was passed through a filter capable of removing particles of over 50 μm size and then reused in the same way as in the above related art under the same conditions, as shown in the "Comparative test 2" column of FIG. 4, there was slight scratching of the wafer W2 with the second use. Further, with the third use, some unevenness was caused in the flatness of the wafer W2 and a large number of scratches were formed.

Further, a test was conducted changing the conditions of the filter 5 and the ultrasonic dispersion apparatus 4 in the evaluation test 3 (evaluation test 4).

That is, in this test, as the filter 5, one having a mesh 51 of 200 μm size was used, the vibrator 41 of the ultrasonic dispersion apparatus 4 was set to a voltage of 100V and a power of 200 W, the vibration element 40 was made to vibrate at a high frequency of 32 kHz to generate an ultrasonic wave, and the slurry S1 was treated ultrasonically for 3 minutes. The rest of the conditions were set to the same as in evaluation test 3.

This reuse after filtration and ultrasonic treatment was repeated five times, whereupon the polishing characteristics of the wafer W2 shown in the "Evaluation test 4" column of FIG. 4 were obtained. That is, even slurry S1 which has been reused five times could give an excellent flatness and did not cause scratches.

Finally, an evaluation test was conducted changing the type of the slurry (evaluation test 5).

In this test, use was made of a slurry comprised of alumina of a primary particle size of 0.35 μm dispersed in water as a dispersant (hereinafter referred to as the "slurry S2"). The rest of the conditions were set to the same as evaluation test 4.

The slurry S2 was reused two times, whereupon the polishing characteristics of the wafer W2 shown in the "Evaluation test 5" column of FIG. 4 was obtained. Even with slurry S2 reused twice, an excellent flatness was obtained and no scratches were caused.

The slurry used in the above evaluation tests were the silica slurry S1 and the alumina slurry S2, but similar effects should be able to be obtained with all slurries where abrasives of a primary particle size of 0.002 μm to 10 μm are dispersed in water or an organic solvent.

That is, the slurries used in a CMP apparatus include ones made using, as an abrasive, silica, alumina, ceria, magnesia, manganese oxide, and other metal oxides, BN, $Si_3N_4$, AlN, and other metal nitrides, SiC and other metal carbides, and metal carbonates and dispersing the same in water, methanol, ethanol, isopropyl alcohol, ethyl Cellosolve, glycerin, polyethylene glycol, benzene, toluene, xylene, and other hydrophilic solvents or new organic solvents and other organic solvents. Further, there are various modes of dispersion such as dispersion of fumed, sol, colloidal, and sintered fine powder abrasives in a solution. The above effects can be obtained for all of these slurries. Further, there are also slurries using surfactants, defoaming agents, oxidizers, and the like along with the above solvent. Similar effects can be obtained for these as well.

Third Embodiment

Figure 5:
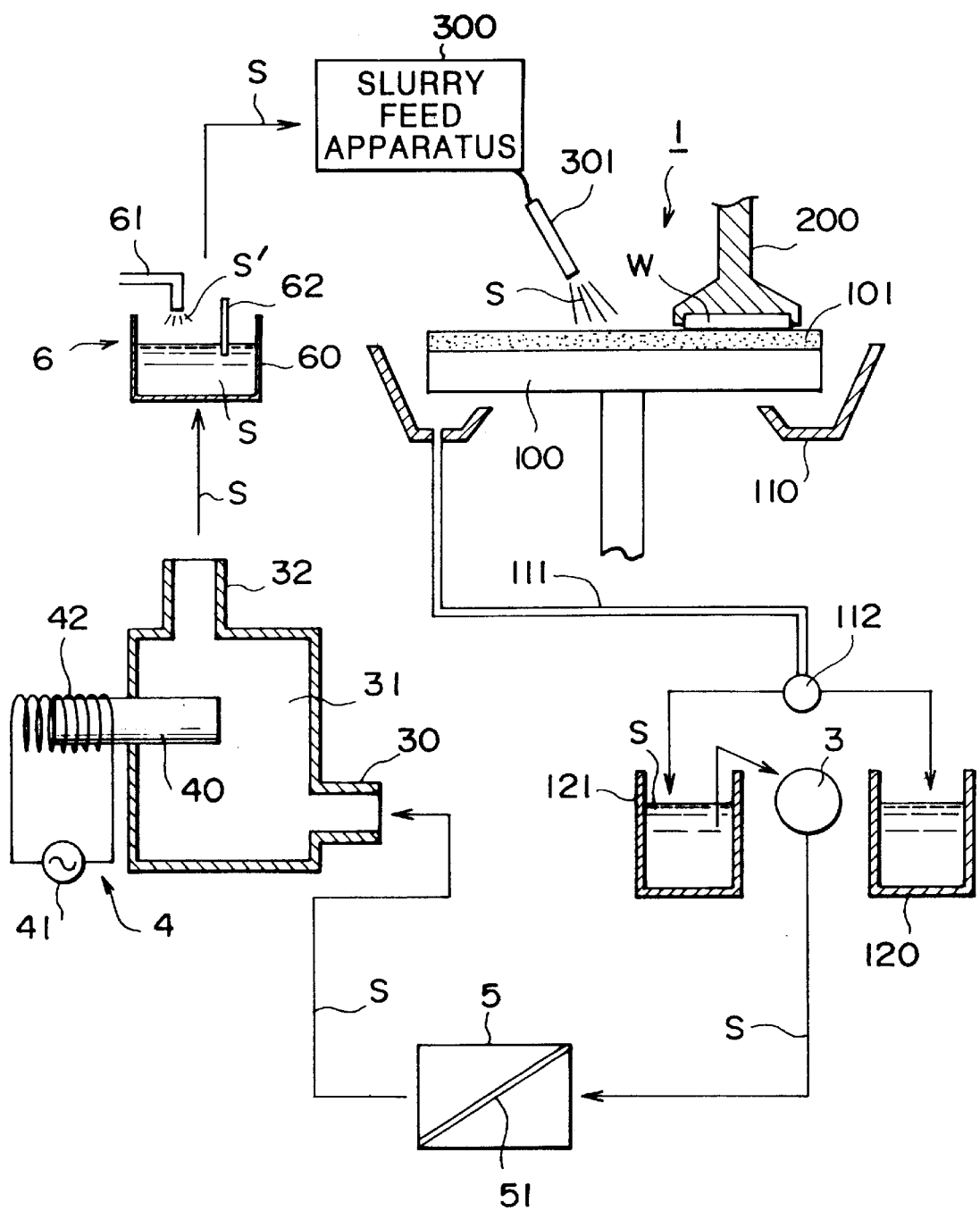
FIG. 5 is a schematic view of an example of application of the slurry recycling system for a CMP apparatus according to a third embodiment of the present invention to a single CMP apparatus.

FIG. 5 is a schematic view of a slurry recycling system of a CMP apparatus according to a third embodiment of the present invention.

The slurry recycling system of this embodiment differs from that of the second embodiment in the point of addition, after the ultrasonic dispersion apparatus 4, of a concentration adjusting tank 6 as a concentration adjustment unit for bringing the concentration of the slurry S close to the concentration of the initial state.

The concentration adjusting tank 6 is comprised of a tank body 60, a supply pipe 61, and a concentration meter 62. The concentration of the slurry S falls due to the dressing, cleaning, etc. during the polishing work in the CMP apparatus 1, so is restored at the concentration adjusting tank 6.

Specifically, the slurry S sent through the ultrasonic dispersion apparatus 4 from the pipe 32 is stored in the tank body 60. High concentration slurry S' is added to the slurry S in the tank body 60 through the supply pipe 61 to raise the concentration of the slurry S. In parallel with this, the change in the concentration of the slurry S is measured by the concentration meter 62. The supply of the slurry S' is stopped when the measured value reaches the concentration of the slurry S of the initial state.

That is, when the slurry S is stored in the tank body 60 of the concentration tank 6, the concentration of the silica is measured by the concentration meter 62 and displayed. Therefore, when the concentration is lower than the concentration of the initial state, high concentration slurry S' is added from the supply pipe 61 to the tank body 60 until the concentration meter 62 displays substantially the concentration of the initial state. When the concentration of the initial state is displayed, the supply of slurry S' from the supply pipe 61 is stopped and the slurry S in the tank body 60 is sent to the slurry feed apparatus 300 (concentration adjusting step).

The rest of the configuration, mode of operation, and effects are similar to those of the above second embodiment, so explanations thereof will be omitted.

Fourth Embodiment

Figure 6:
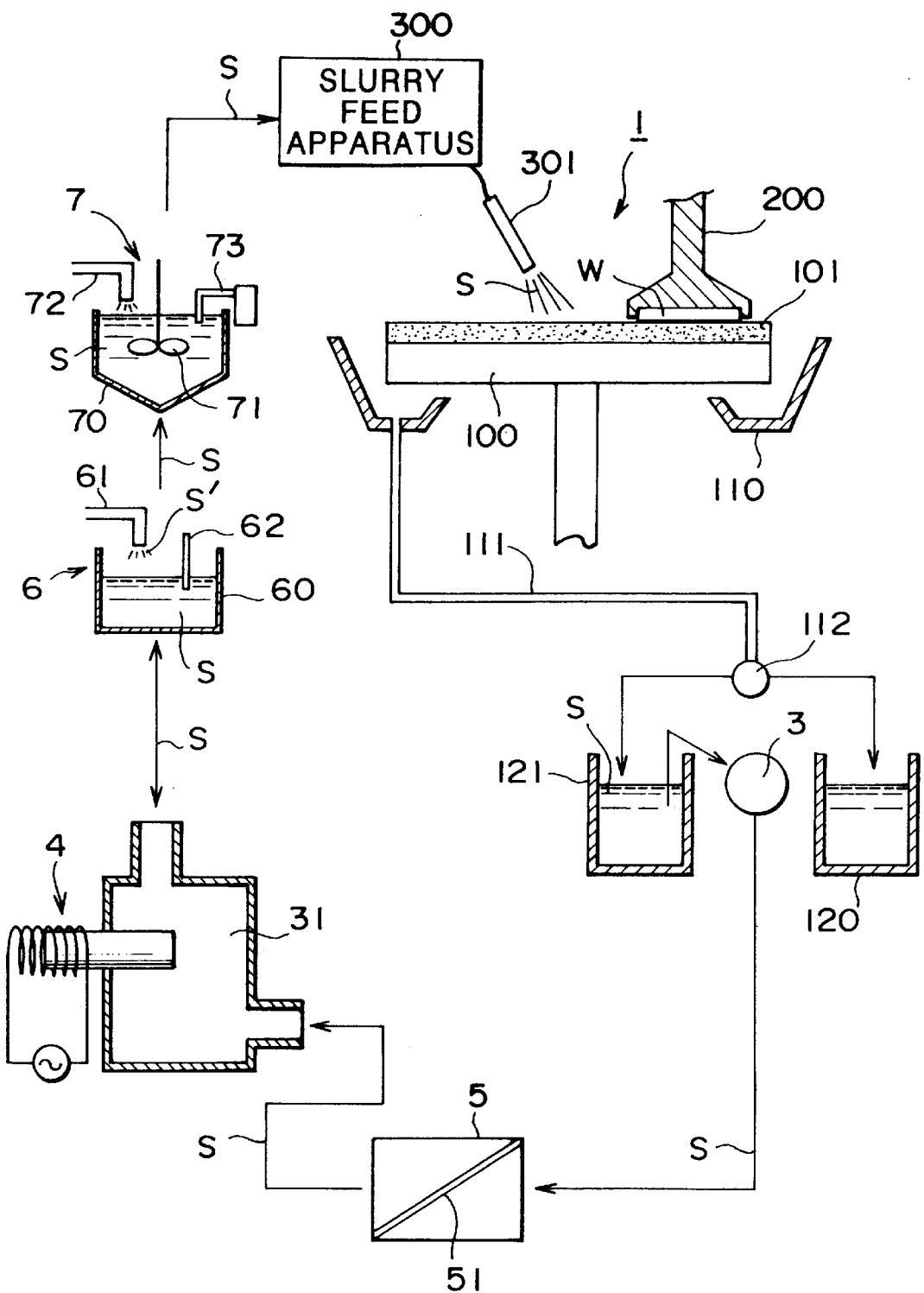
FIG. 6 is a schematic view of an example of application of the slurry recycling system for a CMP apparatus according to a fourth embodiment of the present invention to a single CMP apparatus.

FIG. 6 is a schematic view of a slurry recycling system of a CMP apparatus according to a fourth embodiment of the present invention.

The slurry recycling system of this embodiment differs from the third embodiment in the point of addition, after the concentration adjusting tank 6, of a pH adjuster 7 as a pH adjusting unit for bringing the pH of the slurry S close to the value of the initial state.

The pH adjuster 7 is comprised of a tank 70, a stirrer 71, a supply pipe 72, and a pH meter 73.

That is, slurry S from the concentration adjusting tank 6 passes through piping, not illustrated, connected to the discharge side of the concentration adjusting tank 6 and is stored in the tank 70. An acidic or alkaline agent is supplied from the supply pipe 72 into the slurry S while it is being stirred by the stirrer 71.

Specifically, the pH of the slurry S in the tank 70 is measured by the pH meter 73. When the measured value is lower than the initial pH, that is, when it leans to the acidic side, potassium hydroxide, ammonia, an amine based substance, quaternary ammonium hydroxide, or another alkaline agent is added to the slurry S from the supply pipe 72. Conversely, when the measured value is higher than the initial pH, that is, when it leans to the alkaline side, hydrochloric acid, nitric acid, hydrogen peroxide, or another acidic agent is added to the slurry S. When the value measured by the pH meter 73 reaches substantially the pH of the initial state, the supply of the acidic agent etc. is stopped and the slurry S in the tank 70 is sent to the slurry feed apparatus 300 by a pump etc., not shown (pH adjusting step). Note that this step may be combined with the aforementioned concentration adjusting step.

The rest of the configuration, mode of operation, and effects are similar to those of the above third embodiment, so explanations thereof will be omitted. Note that the invention is not limited to the above embodiments. Various modifications and changes are possible within the gist of the invention.

Figure 7:
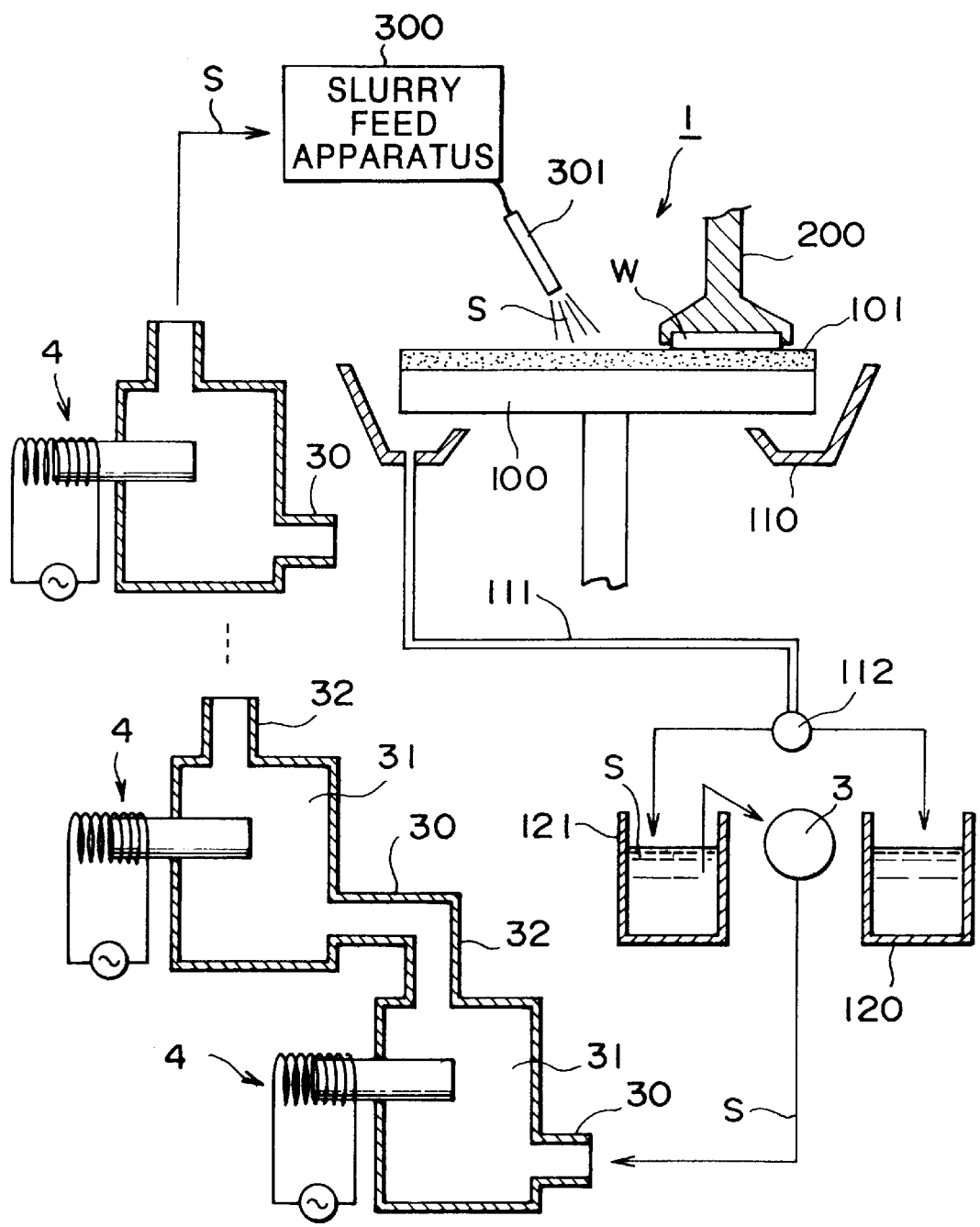
FIG. 7 is a schematic view of a modification of the above embodiments.

In the above embodiments, it is possible to prevent noise by lowering the output of the vibrator 41 of the ultrasonic dispersion apparatus 4, but this might also reduce the effect of dispersion of the particles of the slurry S. Accordingly, when desiring to prevent noise from the ultrasonic dispersion apparatus 4 and also maintain the effect of dispersion, as shown in FIG. 7, it is possible to connect a plurality of ultrasonic dispersion apparatuses 4 in series. Further, when using a single ultrasonic dispersion apparatus 4, it is possible to achieve a similar effect by connecting a separate recirculation pipe from the pipe 32 to the pipe 30 and return the slurry S to the dispersion chamber 31 several times through this recirculation pipe.

Figure 8:
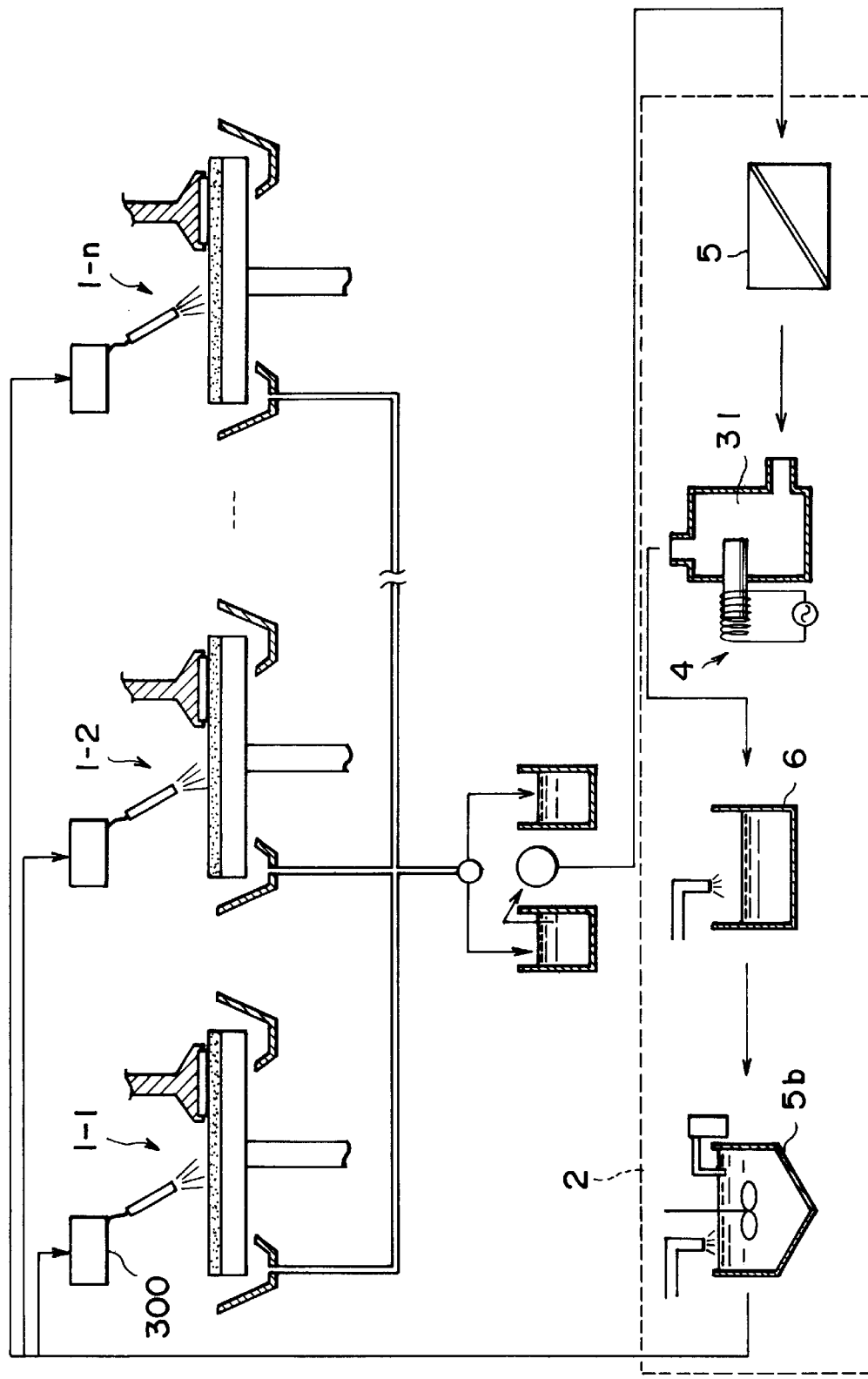
FIG. 8 is a schematic view of another modification of the above embodiments.

Further, in the above embodiments, the example was shown of application to a single CMP apparatus, but as shown in FIG. 8, it is also possible to use a single system 2 to feed the slurry S back to a large number of CMP apparatuses 1-1 to 1-n. Further, it is possible to store the used slurry S produced at a large number of CMP apparatuses 1-1 to 1-n in a single tank, restore the slurry S in the tank at a recycling system installed at a separate location, then distribute the same to the CMP apparatuses 1-1 to 1-n again for reuse.

Further, in the third and fourth embodiments, the filter 5, ultrasonic dispersion apparatus 4, concentration adjusting tank 6, and pH adjuster 7 were arranged in that order, but the invention is not limited to this order. Since however it is better to remove large foreign matter by the filter 5 and reduce the load of the ultrasonic dispersion apparatus 4, the filter 5 is preferably arranged before the ultrasonic dispersion apparatus 4.

Further, while the filter 5 was used as the filtration unit, the invention is not limited to this. It is possible to use all known art capable of removing foreign matter of a particle size of more than 10 μm.

Further, the pH adjuster 7 was used as the pH adjusting unit, but it is possible to use all known art capable of adjusting the pH of the slurry S.

Still further, equipment having the tank body 60 and supply pipe 61 was used as the concentration adjusting unit, but it is of course possible to use all known art capable of adjusting the concentration of abrasive in the slurry S. For example, it is possible to pass the slurry S through a ceramic filter or resin filter provided with a semipermeable membrane to concentrate the slurry S by the same.

As explained above in detail, according to the first and second aspects of the invention, it is possible to use the action of the ultrasonic vibration energy to bring the slurry used in the CMP apparatus close to the state of dispersion of the slurry before use, so reuse of the slurry becomes possible and as a result it is possible to reduce the cost of the polishing work using the CMP apparatus. Further, if the slurry restored to the initial state of dispersion is fed back to the CMP apparatus, continuous operation becomes possible without stopping the CMP apparatus and as a result it becomes possible to improve the operating rate of the CMP apparatus.

Further, according to the preferred embodiments of the first and second aspects of the invention, more complete recycling becomes possible, so it is possible to extend the life of the slurry and as a result possible to reduce the cost of the polishing work and improve the operating rate of the CMP apparatus.

What is claimed is:

1. A slurry recycling system of a CMP apparatus comprising:

a flow unit for causing the flow of a slurry comprised of abrasive grains of a metal oxide, metal nitride, metal carbide, or metal carbonate of a primary particle size in the initial state of 0.002 μm to 10 μm dispersed in water or an organic solvent and already used in the CMP apparatus; and an ultrasonic dispersion unit having a vibration element arranged entirely within said flow unit and a vibrator for making the vibration element vibrate to generate ultrasonic vibration energy in said flow unit wherein said ultrasonic dispersion unit causes the abrasive grains to disperse.

2. A slurry recycling system of a CMP apparatus as set forth in claim 1, further comprising, in said flow unit, a filtration unit for filtering out the foreign matter of more than 10 μm size in the slurry.

3. A slurry recycling system of a CMP apparatus as set forth in claim 1, further comprising, in said flow unit, a concentration adjusting unit for bringing the concentration of the slurry close to the concentration of the initial state.

4. A slurry recycling system of a CMP apparatus as set forth in claim 1, further comprising, in said flow unit, a pH adjusting unit for bringing the pH of the slurry close to the value of the initial state.

5. A slurry recycling method of a CMP apparatus comprising:

a slurry flow step of causing the flow of a slurry comprised of abrasive grains of a metal oxide, metal nitride, metal carbide, or metal carbonate of a primary particle size in the initial state of 0.002 μm to 10 μm dispersed in water or an organic solvent and already used in the CMP apparatus; and an ultrasonic dispersion step of arranging a vibration element of an ultrasonic vibrator in the flow of the slurry and applying ultrasonic vibration energy to the slurry to cause the agglomerated abrasive grains to disperse and restore the state of dispersion of the slurry to close to the initial state.

6. A slurry recycling method of a CMP apparatus as set forth in claim 5, further comprising a filtration step of filtering out the foreign matter of more than 10 μm size in the slurry.

7. A slurry recycling method of a CMP apparatus as set forth in claim 5, further comprising a concentration adjusting step for bringing the concentration of the slurry close to the concentration of the initial state.

8. A slurry recycling method of a CMP apparatus as set forth in claim 5, further comprising a pH adjusting step for bringing the pH of the slurry close to the value of the initial state.

* * * * *